United States Patent
Jones et al.

(10) Patent No.: US 6,427,092 B1
(45) Date of Patent: *Jul. 30, 2002

(54) METHOD FOR CONTINUOUS, NON LOT-BASED INTEGRATED CIRCUIT MANUFACTURING

(75) Inventors: Mark L. Jones; Gregory A. Barnett, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/137,781

(22) Filed: Aug. 20, 1998

Related U.S. Application Data

(63) Continuation of application No. 08/822,731, filed on Mar. 24, 1997, now Pat. No. 5,856,923.

(51) Int. Cl.$^7$ .............................................. G06F 19/00

(52) U.S. Cl. ...................... 700/121; 700/100; 700/115; 700/116; 700/221; 700/224; 700/227; 702/117; 702/118; 324/759; 324/765; 382/141; 382/145; 209/573; 209/583

(58) Field of Search ............................ 700/95, 96, 108, 700/109, 110, 115, 116, 117, 121, 214, 215, 221, 222, 223, 224, 226, 225, 227, 229; 707/3, 10, 103, 104, 203; 702/117–118; 382/141, 142, 149, 145; 209/573, 583, 571; 324/759, 765; 438/14, 62, 60, 1; 716/4, 17

(56) References Cited

U.S. PATENT DOCUMENTS

| | | | |
|---|---|---|---|
| 4,958,373 A | 9/1990 | Usami et al. ............... 382/149 |
| 4,967,381 A | 10/1990 | Lane et al. ................... 702/81 |
| 5,103,166 A | 4/1992 | Jeon et al. .................. 324/764 |
| 5,105,362 A | 4/1992 | Kotani ........................ 700/108 |
| 5,217,834 A | 6/1993 | Higaki ......................... 430/30 |
| 5,219,765 A | 6/1993 | Yoshida et al. ............... 438/10 |
| 5,226,118 A | 7/1993 | Baker et al. ................ 345/357 |
| 5,271,796 A | 12/1993 | Miyashita et al. ............ 438/16 |
| 5,289,113 A | 2/1994 | Meaney et al. ............ 324/73.1 |
| 5,294,812 A | 3/1994 | Hashimoto et al. ........... 257/65 |
| 5,301,143 A | 4/1994 | Ohri et al. ..................... 365/96 |
| 5,420,796 A | 5/1995 | Weling et al. ................. 438/5 |
| 5,440,493 A | 8/1995 | Doida ......................... 700/99 |
| 5,442,561 A | 8/1995 | Yoshizawa et al. ......... 700/100 |
| 5,450,326 A | 9/1995 | Black ......................... 700/121 |
| 5,467,304 A | 11/1995 | Uchida et al. .............. 365/174 |
| 5,483,175 A | 1/1996 | Ahmad et al. ................ 438/18 |
| 5,495,417 A | 2/1996 | Fuduka et al. .............. 700/121 |
| 5,511,005 A | 4/1996 | Abbe et al. ................... 702/84 |
| 5,568,408 A | 10/1996 | Maeda ....................... 702/117 |
| 5,625,816 A | * 4/1997 | Burdick et al. ............. 707/103 |
| 5,844,803 A | * 12/1998 | Befa .......................... 700/121 |
| 5,856,923 A | * 1/1999 | Jones et al. ................. 700/121 |
| 5,889,674 A | * 3/1999 | Burdick et al. ............. 700/121 |

(List continued on next page.)

FOREIGN PATENT DOCUMENTS

JP 5-74909 3/1993

OTHER PUBLICATIONS

Abstract from JP–74909, in english.

*Primary Examiner*—Ramesh Patel
(74) *Attorney, Agent, or Firm*—TraskBritt

(57) ABSTRACT

A method for continuous, non lot-based manufacturing of integrated circuit (IC) devices of the type to each have a unique fuse identification (ID) includes: reading the fuse ID of each of the IC devices; advancing multiple lots of the IC devices through, for example, a test step in the manufacturing process in a substantially continuous manner; generating data, such as test data, related to the advancement of each of the IC devices through the step in the process; and associating the data generated for each of the IC devices with the fuse ID of its associated IC device.

24 Claims, 2 Drawing Sheets

U.S. PATENT DOCUMENTS

| | | | | |
|---|---|---|---|---|
| 5,907,492 A | * | 5/1999 | Akram et al. | 700/121 |
| 5,915,231 A | * | 6/1999 | Beffa | 702/118 |
| 5,927,512 A | * | 7/1999 | Beffa | 209/573 |
| 6,049,624 A | * | 4/2000 | Wilson et al. | 382/145 |
| 6,100,486 A | * | 8/2000 | Beffa | 209/573 |
| 6,122,563 A | * | 9/2000 | Beffa | 700/121 |
| 6,147,316 A | * | 11/2000 | Beffa | 209/573 |
| 6,148,307 A | * | 11/2000 | Burdick et al. | 707/104 |
| 6,226,394 B1 | * | 5/2001 | Wilson et al. | 382/145 |
| 2000/0021265 | * | 9/2001 | Wilson et al. | 382/145 |

* cited by examiner

METHOD FOR CONTINUOUS, NON LOT-BASED INTEGRATED CIRCUIT MANUFACTURING

CROSS-REFERENCE TO RELATED APPLICATIONS

This application is a continuation of an application of the same title, having Ser. No. 08/822,731, filed Mar. 24, 1997, now U.S. Pat. No. 5,856,923

The present application is related to: a co-pending application having Ser. No. 08/591,238, entitled "METHOD AND APARATUS [sic] FOR STORAGE OF TEST RESULTS WITHIN AN INTEGRATED CIRCUIT," and filed Jan. 17, 1996; a co-pending application having Ser. No. 08/664,109, entitled "A STRUCTURE AND A METHOD FOR STORING INFORMATION IN A SEMICONDUCTOR DEVICE," and filed Jun. 13, 1996; a co-pending application having Ser. No. 08/785,353 filed Jan. 17, 1997 entitled "METHOD FOR SORTING INTEGRATED CIRCUIT DEVICES," and filed Jan. 17, 1997; a co-pending application having Ser. No. 08/801,565, now U.S. Pat. No. 5,544,803, entitled "METHOD OF SORTING A GROUP OF INTEGRATED CIRCUIT DEVICES FOR THOSE DEVICES REQUIRING SPECIAL TESTING," and filed Feb. 17, 1997; a co-pending application having Ser. No. 08/806,442, now U.S. Pat. No. 5,915,231, entitled "METHOD IN AN INTEGRATED CIRCUIT (IC) MANUFACTURING PROCESS FOR IDENTIFYING AND REDIRECTING IC'S MIS-PROCESSED DURING THEIR MANUFACTURE," and filed Feb. 26, 1997; and a co-pending application having Ser. No. 08/871,015, now U.S. Pat. No. 5,907,492, entitled "METHOD FOR USING DATA REGARDING MANUFACTURING PROCEDURES INTEGRATED CIRCUITS (IC'S) HAVE UNDERGONE, SUCH AS REPAIRS, TO SELECT PROCEDURES THE IC'S WILL UNDERGO, SUCH AS ADDITIONAL REPAIRS," and filed Jun. 6, 1997.

BACKGROUND

1. Field of the Invention

The present invention relates in general to integrated circuit (IC) manufacturing and, more specifically, to methods for tracking IC devices in a substantially continuous flow of IC devices from multiple lots through one or more steps in an IC manufacturing process.

2. State of the Art

Integrated circuits (IC's) are small electronic circuits formed on the surface of a wafer of semiconductor material, such as silicon, in an IC manufacturing process referred to as "fabrication." Once fabricated, IC's are probed to evaluate a variety of their electronic characteristics, cut from the wafer on which they were formed into discrete IC dice or "chips," and then assembled for customer use using various well-known IC packaging techniques, including lead frame packaging, Chip-On-Board (COB) packaging, and flip-chip packaging.

During the manufacturing process, IC's generally undergo a variety of tests to ensure they will function properly once shipped. Testing typically involves a variety of known test steps, such as speed grading, burn-in, and final, which test IC's for defects and functionality and grade IC's for speed.

IC's are typically tracked through the fabrication, probe, assembly, and test steps described above so correlations can be found between the results of tests performed on IC's in the test steps and the "path" the IC's took through the manufacturing process. For example, by tracking a group of IC's through the manufacturing process, it might be determined that IC's wire-bonded on a particular wire-bonding machine have an unusually high failure rate when tested. Similarly, it might be determined that a test machine itself is failing a disproportionate number of IC's. In either case, tracking IC's through the manufacturing process allows the source of a problem to be pinpointed and addressed.

As shown in FIG. 1, a conventional procedure 10 for tracking IC's through a process step 12 in an IC manufacturing process involves the use of lot numbers for the IC's. Lot numbers are first assigned to wafers during fabrication. Typically, a group of 20–50 wafers receives a single unique lot number (e.g., 36/1/9970). As the group of wafers proceeds to probe, the wafers are typically split into several sub-lots, with each sub-lot being assigned a new lot number (sometimes referred to as a "sub-lot" number) that is a modified form of the group's original lot number (e.g., 36/1/9970/0, 36/1/9970/1, . . . ). As the group continues through the manufacturing process, sub-lots are split and re-split for a variety of reasons until the group is typically split into many sub-lots, all having a unique lot number that is a modified form of the group's. original lot number.

In the conventional tracking procedure 10, a sub-lot (e.g., sub-lot H) is received from an input queue 14 where sub-lots wait to proceed through the process step 12. The process step 12 may be any step in the IC manufacturing process including, for example, probe, wafer saw, speed grading, burn-in, or final testing.

As a sub-lot advances through the process step 12, data 16 related to the process step 12 is generated. Such data 16 may include, for example: an identification of the processing equipment and the operating personnel for the process step 12; information regarding the set-up of the process step 12; the time and date the sub-lot advanced through the process step 12; and yield and test results from the process step 12.

Once a sub-lot has advanced through the process step 12, a process report 18 is manually or automatically generated based on the generated data 16. To associate the report 18, and hence the data 16, with the IC's in the sub-lot, and thus track the IC's through the process step 12, the report 18 lists the lot number (e.g., "H") of the IC's in the sub-lot. Typically, the report 18 also physically accompanies the sub-lot through the remainder of the manufacturing process to ensure that the data 16 is correlated with the IC's in the sub-lot, although this is not necessary if other indicia identifying the lot number of the IC's in the sub-lot physically accompany the sub-lot through the manufacturing process.

With the report 18 generated, a processed sub-lot (e.g., sub-lot H) is cleared from equipment associated with the process step 12 to an output queue 20 to prepare the process step 12 for processing another sub-lot (e.g., sub-lot I). Once the processed sub-lot is cleared, the next sub-lot can be processed. This "clearing" process is necessary because if two sub-lots (e.g., sub-lots H and I) proceed through the process step 12 in a continuous manner, the conventional tracking procedure 10 is unable to correlate the data 16 and the process report 18 generated as each of the two sub-lots proceed with the correct sub-lot. Instead, the data 16 for the two sub-lots is mixed, causing the conventional tracking procedure 10 to fail to uniquely track the two sub-lots through the process step 12.

The conventional tracking procedure described above is problematic because it makes inefficient use of often very expensive manufacturing and test equipment and other resources by leaving sub-lots "parked" in input queues while process reports are generated and the equipment is cleared of already processed sub-lots. In process steps which use multiple machines in parallel to process a sub-lot, some machines may be idle while other machines finish their allotment from the sub-lot being processed and the next sub-lot waits in an input queue. In addition, generation of the process reports, as well as clearing a processed sub-lot from equipment, often requires laborious manual work by operating personnel. Further, a process report that must physically accompany a sub-lot through the manufacturing process may become lost or damaged, and thus is not as reliable a means of tracking IC's as is desired.

As described in U.S. Pat. Nos. 5,301,143, 5,294,812, and 5,103,166, some methods have been devised to aid quality control personnel in tracking IC's undergoing failure analysis back to the wafer from which they come. By tracking the IC's back to their wafer, test data related to the IC's can be correlated to the wafer to pinpoint possible problems with the wafer. Such methods take place "off" the manufacturing line, and involve the use of electrically retrievable identification (ID) codes, such as so-called "fuse ID's," programmed into individual IC's to identify the IC's. Fuse ID's and other electrically retrievable ID codes are typically programmed into IC's by blowing selected fuses or anti-fuses in circuitry on the IC's so that the circuitry outputs the ID code when accessed. Unfortunately, none of these methods addresses the inefficiency problems caused by the conventional lot-based tracking procedure described above.

Therefore, there is a need in the art for a procedure for tracking IC's through an IC manufacturing process that uses manufacturing resources more efficiently. Such a procedure should not leave equipment idle while IC's wait to be processed. In addition, such a procedure should achieve a level of reliability not reached by conventional tracking procedures.

SUMMARY OF THE INVENTION

An inventive method for tracking integrated circuit (IC) devices of the type to each have a substantially unique identification ( ID) code (e.g., a fuse ID) through a step in an IC manufacturing process includes: reading the ID code of each of the IC devices; advancing multiple lots of the IC devices through the step in the manufacturing process in a substantially continuous manner; generating data, such as processing equipment data or test data, related to the advancement of each of the IC devices through the step in the process; and associating the data generated for each of the IC devices with the ID code of its associated IC device.

By associating the data with the ID codes, the inventive method allows the IC devices to be tracked through the step in the process. Further, because multiple lots of the IC devices can advance through the step in the manufacturing process continuously, manufacturing resources are used more efficiently. In addition, because the ID codes and associated data read and generated using the inventive method need not physically accompany IC's as they progress through the manufacturing process, the inventive method is more reliable than conventional tracking procedures.

In another embodiment, a method of manufacturing IC devices from semiconductor wafers includes: providing wafers in multiple lots; fabricating IC's on the wafers; causing each of the IC's to permanently store a substantially unique ID code, such as a fuse ID; separating the IC's from their wafers to form IC dice; assembling the IC dice into IC devices; reading the IC code from the IC in each of the IC devices; testing each of the IC devices; while testing the IC devices: advancing the IC devices from the multiple lots of wafers through at least one test step in a substantially continuous manner; generating data related to the advancement of each of the IC devices through the test step; and associating the data generated for each of the IC devices with the ID code of the IC in its associated IC device.

In a further embodiment, a method for correlating variables related to an IC manufacturing process with variables related to the performance of IC devices as they advance through the process includes: causing each of multiple IC's from multiple lots to permanently store a substantially unique ID code, such as a fuse ID; reading the ID code from each of the IC devices; advancing the IC devices from the multiple lots through at least one step in the manufacturing process in a substantially continuous manner; while the IC devices advance through the step in the manufacturing process, generating data related to process variables associated with the step in the process; generating data related to variables associated with the performance of at least some of the IC devices as they advance through at least one step in the manufacturing process; and associating the process variable-related data and the performance variable-related data generated for each of the IC devices with the ID code of the IC device associated with the data to correlate the process variables with the performance variables.

DETAILED DESCRIPTION OF THE PREFERRED EMBODIMENT

Figure 1:
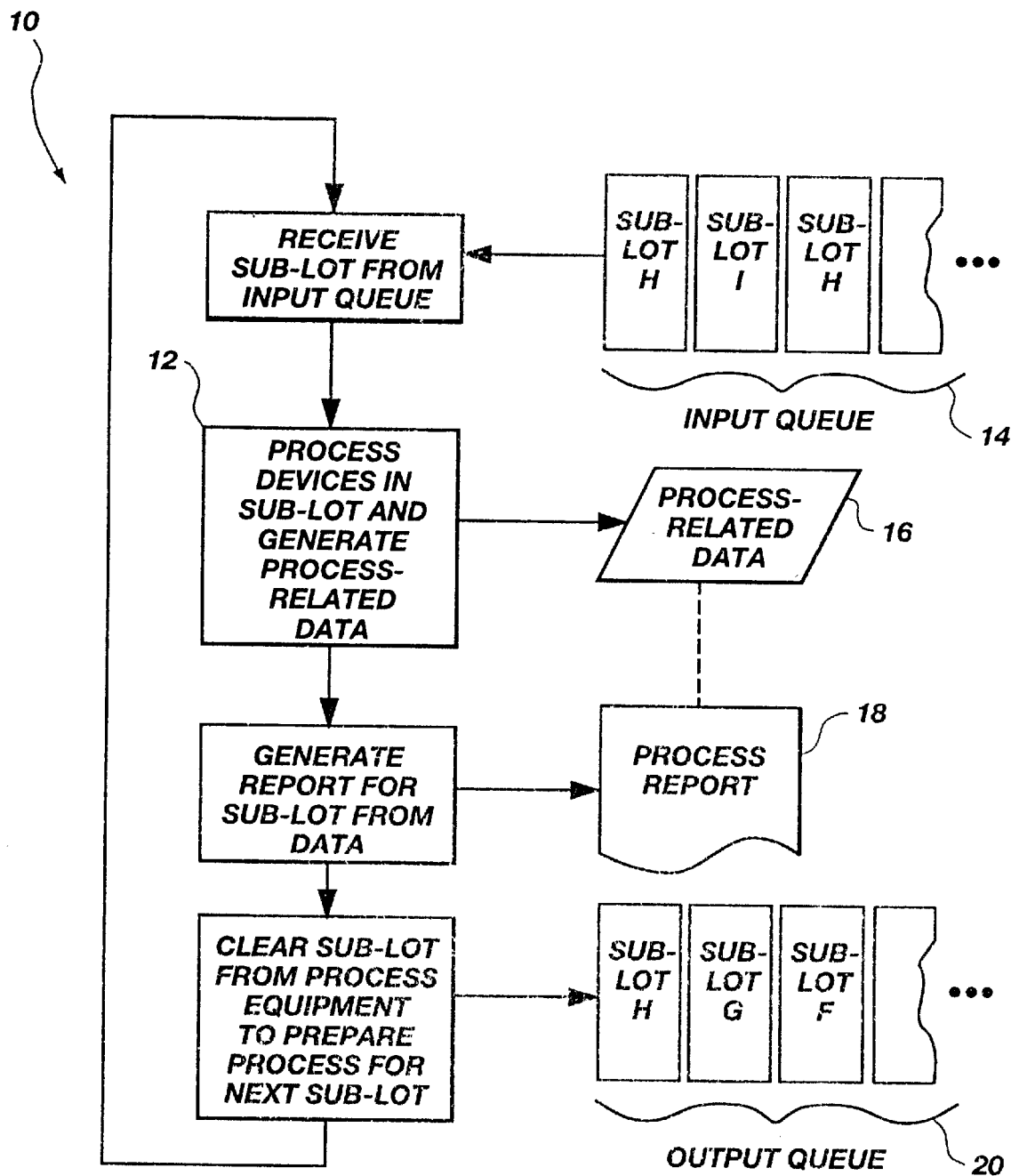
FIG. 1 is a flow diagram showing a process step in a conventional lot-based integrated circuit (IC) manufacturing process.
Figure 2:
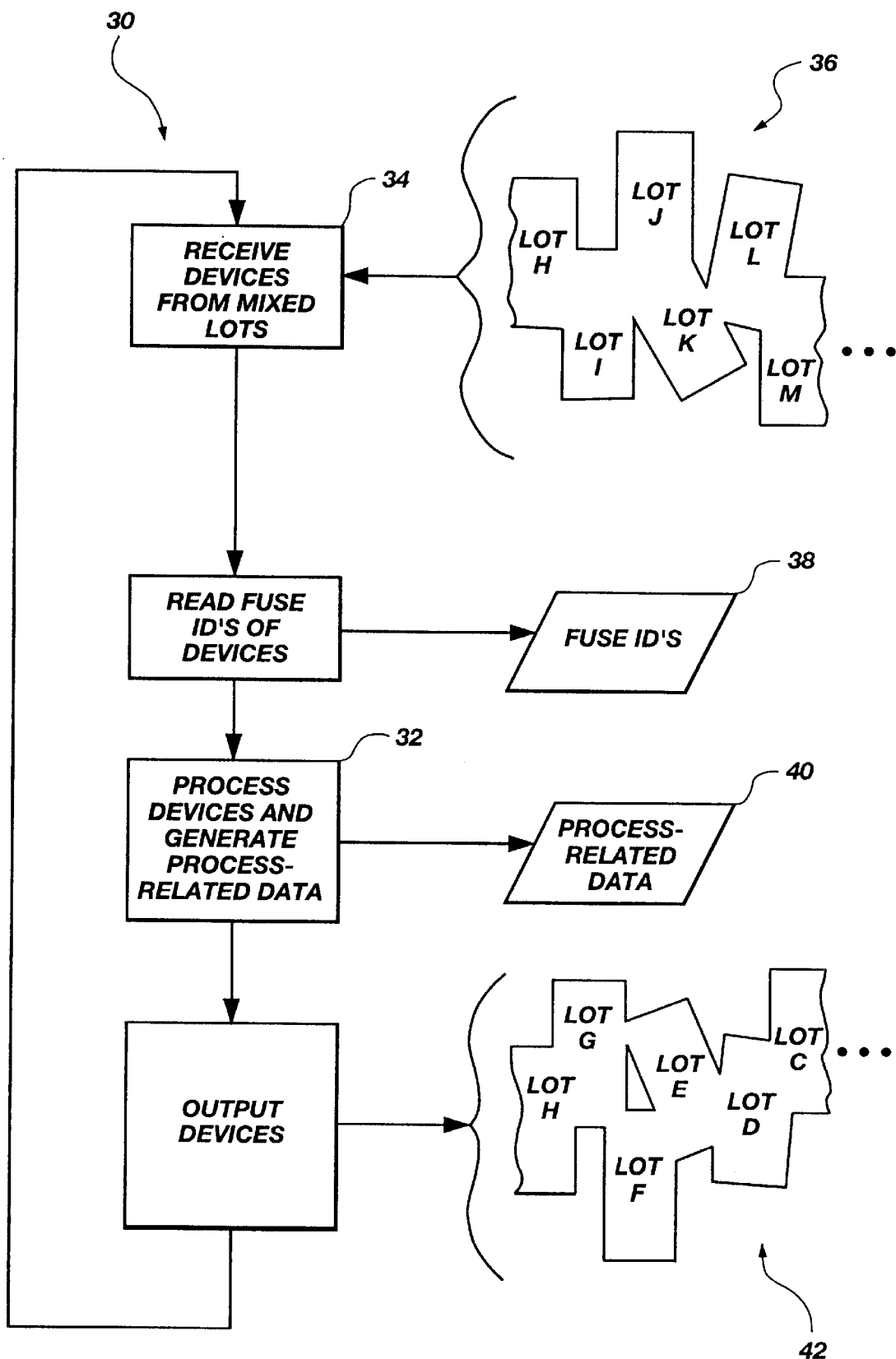
FIG. 2 is a flow diagram showing a process step in a substantially continuous, non lot-based IC manufacturing process in accordance with the present invention.

As shown in FIG. 2, an inventive method 30 for tracking integrated circuit (IC) devices through a step 32 in an IC manufacturing process includes a step 34 of receiving IC devices from multiple, mixed lots 36. It will be understood by those having skill in the field of this invention that the invention is applicable to any IC devices, including Dynamic Random Access Memories (DRAM's), Static Random Access Memories (SRAM's), Synchronous DRAM's (SDRAM's), processors, Application Specific IC's (ASIC's), Read Only Memory (ROM) IC's, Electrically Erasable Programmable ROM (EEPROM) IC's, and to mixtures of different types of IC devices. Further, it will be understood that the step 32 may be any step in an IC manufacturing process, including assembly and test steps. It will also be understood that the step 32 may encompass processing by a single machine, part of a machine, many machines operating in series or parallel, or any combination thereof. In addition, it will be understood that the step 34 of receiving IC devices from multiple, mixed lots 36 is without regard to the lots from which the IC devices come, and thus allows a more efficient use of processing equipment than traditional lot-based procedures. It will also be understood, of course, that although the present invention is described as being implemented in a single process step 32 for ease of understanding, the invention more typically is implemented on a series of process steps, such as all back-end test steps.

The IC devices are each programmed with a unique identification (ID) code, such as the well-known fuse ID described above. Briefly, a fuse ID is programmed in an IC device by selectively blowing fuses or anti-fuses in a circuit on the IC device so that when the circuit is accessed, it outputs an ID code. Although it is preferable that the ID code programmed into each IC device be unique by specifying, for example, a lot number, wafer number, and wafer position for the IC device, it is not necessary to implement the present invention. For example, if the ID code is the same for all IC devices derived from the same semiconductor wafer, or from the same lot, it will work for purposes of the present invention.

Before or after the IC devices progress through the process step 32, their ID codes are read and stored in a computer as data 38. As the IC devices progress through the process step 32, data 40 related to the process step 32 is generated for each IC device. Such data 40 may include, for example, process variables such as the processing equipment used, the operating personnel present, the set-up, and the time and date of processing for the process step 32, and performance variables such as yield and test results from the process step 32. The set-up for the process step 32 may include, for example, a standard set-up or a set-up in accordance with a Special Work Request (SWR) by engineering personnel.

The ID code data 38 and process-related data 40 may be automatically correlated by computer with data from process steps prior to the process step 32 through reference to the ID codes common to the ID code data 38 generated in the process step 32 and ID code data generated in the prior process steps. As a result, correlations can be found between process variables, such as the processing equipment used, and performance variables, such as test results. Thus for example, it might be discerned that the IC devices derived from a particular section of the semiconductor wafers provided by a particular supplier have an unusually high failure rate at a particular test step. The process of correlation is preferably performed in real time so information is available immediately, although it is within the scope of the present invention to perform the correlation at a later time.

Once the IC devices have advanced through the process step 32, the processed IC devices are output from the process step 32 to mixed output lots 42. It should be understood that, in some cases the processed IC devices must be cleared from processing equipment before other IC devices can be processed, and in other cases, such as in serial-feed machines, processed IC devices are being output from the process step 32 while other IC devices are advancing through the process step 32 and still other IC devices are being received by the process step 32. Any of these cases fall within the scope of the present invention.

It should be understood that by reading the ID codes of processed IC devices and associating those codes with data generated during processing, the inventive method 30 avoids the need for lot-based manufacturing altogether. The input and output lots 36 and 42 may then be mixed without regard to lots, and the processing of IC devices through the process step 32 may proceed in a substantially continuous fashion, thus dramatically improving the utilization of processing equipment. In addition, because the ID codes and associated data read and generated using the inventive method need not physically accompany IC's as they progress through the manufacturing process, the inventive method is more reliable than conventional tracking procedures.

Although the present invention has been described with reference to a particular embodiment, the invention is not limited to this described embodiment. For example, the present invention includes within its scope the manufacture of Single In-line Memory Modules (SIMM's) and Dual In-line Memory Modules (DIMM's), as well as the IC devices described above. Thus, the invention is limited only by the appended claims, which include within their scope all equivalent methods that operate according to the principles of the invention as described.

What is claimed is:

1. A method in an integrated circuit (IC) device manufacturing process for tracking IC devices through the manufacturing process, the method comprising:
   providing each of the IC devices with an identification (ID) code;
   reading the identification (ID) code of each of the IC devices;
   advancing the IC devices through the manufacturing process in a substantially continuous manner;
   generating data related to the advancement of each of the IC devices through the manufacturing process; and
   associating the data generated for each of the IC devices with the identification (ID) code of its associated IC device.

2. The method of claim 1 wherein each of the IC devices is programmed with a substantially unique, electrically retrievable identification (ID) code, wherein reading the identification (ID) code of each of the IC devices comprises electrically retrieving the identification (ID) code of each of the IC devices.

3. The method of claim 1 wherein each of the IC devices is programmed with a unique fuse ID, wherein reading the identification (ID) code of each of the IC devices comprises reading the unique fuse ID programmed into each of the IC devices.

4. The method of claim 1 wherein advancing the IC devices through the IC device manufacturing process includes advancing the IC devices through an assembly step.

5. The method of claim 1 wherein advancing the IC devices through the IC device manufacturing process includes advancing the IC devices through a test step.

6. The method of claim 1 wherein reading the identification (ID) code of each of the IC devices occurs before advancing the IC devices through the IC device manufacturing process.

7. The method of claim 1 wherein advancing the IC devices through the manufacturing process includes advancing the IC devices serially through multiple machines associated with the manufacturing process.

8. The method of claim 1 wherein advancing the IC devices through the manufacturing process includes advancing the IC devices through parallel machines associated with the manufacturing process.

9. The method of claim 1 wherein generating data related to the advancement of each of the IC devices through the process comprises generating data selected from a group consisting of processing equipment data, processing personnel data, processing set-up data, time and date data, yield data, and test data.

10. The method of claim 1 further comprising storing the identification (ID) code of each of the IC devices, wherein associating the data generated for each of the IC devices with the identification (ID) code of its associated IC device comprises storing the data generated for each of the IC devices in association with the stored identification (ID) code of its associated IC device.

11. The method of claim 1 wherein each of the IC devices has an associated lot ID, wherein associating the data generated for each of the IC devices with the identification (ID) code of its associated IC device comprises storing the data generated for each of the IC devices in association with the lot ID of its associated IC device.

12. A method in an integrated circuit (IC) device manufacturing process for tracking IC devices through back-end test steps in the manufacturing process, the method comprising:

programming each of the IC devices with a unique fuse identification (ID);

for each of the back-end test steps, reading the unique fuse identification (ID) of each of the IC devices;

advancing the IC devices through the back-end test steps in the manufacturing process in a substantially continuous manner;

generating data related to the advancement of each of the IC devices through the back-end test steps; and associating the data generated for each of the IC devices with the unique fuse identification (ID) of its associated IC device.

13. A method of manufacturing integrated circuit (IC) devices from a semiconductor wafer, the method comprising:

fabricating a plurality of IC's on a wafer;

causing each of the IC's to store a substantially unique identification (ID) code;

separating each of the IC's from said wafer to form one of a plurality of IC devices;

reading the unique identification (ID) code from each of the IC devices;

testing each of the IC devices;

while manufacturing the IC devices:
    advancing the IC devices through at least one manufacturing step in a substantially continuous manner;
    generating data related to the advancement of each of the IC devices through the at least one manufacturing step; and
    associating the data generated for each of the IC devices with the unique identification (ID) code of the IC in its associated IC device.

14. The method of claim 13 wherein fabricating a plurality of IC's on the wafer comprises fabricating IC's of different types selected from a group consisting of Dynamic Random Access Memory (DRAM) IC's, Static Random Access Memory (SRAM) IC's, Synchronous DRAM (SDRAM) IC's, processor IC's, Application Specific IC's (ASIC's), Read Only Memory (ROM) IC's, and Electrically Erasable Programmable ROM (EEPROM) IC's.

15. The method of claim 13 wherein causing each of the IC's to store a substantially unique identification (ID) code comprises programming each of the IC's to permanently store a unique fuse ID.

16. The method of claim 15 wherein programming each of the IC's to permanently store a unique fuse ID comprises programming at least one of fuses and anti-fuses in each of the IC's to permanently store a unique fuse ID.

17. The method of claim 13 wherein testing each of the IC devices includes speed grading, burn-in, and final testing.

18. The method of claim 13 wherein generating data related to the advancement of each of the IC devices through the manufacturing step comprises generating data identifying test steps the IC devices have progressed through and pass/fail results for those test steps, wherein the method further comprises the act of affirming that the IC devices have progressed through and passed the identified test steps before advancing the IC devices through at least one test step subsequent to the at least one test step the IC devices progress through in a substantially continuous manner.

19. The method of claim 13 further comprising holding some of the IC devices in accordance with their unique identification (ID) codes.

20. A method in an integrated circuit (IC) device manufacturing process for correlating process-related variables with performance variables related to the performance of IC devices as they advance through the manufacturing process, the method comprising:

providing a plurality of IC devices with identification (ID) codes;

reading the identification (ID) code from each of the IC devices;

advancing the IC devices through at least one step in the manufacturing process in a substantially continuous manner;

while the IC devices advance through the step in the manufacturing process, generating data related to process variables associated with the step in the manufacturing process;

generating data related to performance variables associated with the performance of at least some of the IC devices as they advance through at least one step in the manufacturing process; and associating the process variable-related data and the performance variable-related data generated for each of the IC devices with the identification (ID) code of the IC device associated with the data.

21. The method of claim 20 wherein generating data related to process variables associated with the step in the process comprises generating data related to process variables selected from a group comprising processing equipment, processing personnel, processing set-up, and time and date.

22. The method of claim 20 wherein generating data related to performance variables associated with the performance of at least some of the IC devices as they advance through at least one step in the manufacturing process comprises generating data related to performance variables selected from a group comprising yield and test results.

23. The method of claim 20 wherein providing each of the plurality of IC devices with an identification (ID) code comprises programming each of the plurality of IC devices to permanently store a unique fuse ID which specifies a lot ID, work week, wafer ID, die location, and fabrication facility ID for the IC device.

24. A method of manufacturing Integrated Circuit (IC) modules from semiconductor wafers, the method comprising:

providing a plurality of semiconductor wafers;

fabricating a plurality of IC's on each wafer of the plurality of semiconductor wafers;

causing each of the IC's on each wafer of the plurality of semiconductor wafers to store an identification (ID) code;

separating each of the IC's on each wafer of the plurality of semiconductor wafers from its wafer to form one of a plurality of IC dice;

assembling a plurality of IC modules from the IC dice;

reading the identification (ID) codes from the IC dice in each of the IC modules; testing each of the IC dice in each of the IC modules; while manufacturing the IC modules:
    advancing the IC modules through at least one manufacturing step in a substantially continuous manner;
    generating data related to the advancement of the IC modules through the manufacturing step; and
    associating the data generated for each of the IC modules with the identification (ID) codes of its associated IC dice.

* * * * *

UNITED STATES PATENT AND TRADEMARK OFFICE
CERTIFICATE OF CORRECTION

PATENT NO. : 6,427,092 B1
DATED : July 30, 2002
INVENTOR(S) : Mark L. Jones and Gregory A. Barnett It is certified that error appears in the above-identified patent and that said Letters Patent is hereby corrected as shown below:

Title page,
Item [56], References Cited, U.S. PATENT DOCUMENTS, change "2000/0021265" to -- 2001/0021265 --

Column 2,
Line 24, change "group's." to -- group's --

Column 5,
Line 42, insert comma after "cases"

Signed and Sealed this

Twenty-eighth Day of June, 2005

JON W. DUDAS
*Director of the United States Patent and Trademark Office*